United States Patent

Han et al.

Patent Number: 5,989,043
Date of Patent: Nov. 23, 1999

[54] POWER SWITCH ON/OFF MECHANISM OF PLUG-IN UNIT DRIVEN BY AN INSERTION/EJECTION DEVICE IN A PRINTED CIRCUIT BOARD

[75] Inventors: Jae-Sup Han; Kwang-Soo Kim; Young-Soo Lee; Nam-Il Her, all of Daejon, Rep. of Korea

[73] Assignee: Electronics and Telecommunications Research Institute, Daejeon, Rep. of Korea

[21] Appl. No.: 08/870,388

[22] Filed: Jun. 6, 1997

[30] Foreign Application Priority Data

Oct. 11, 1996 [KR] Rep. of Korea ............... 96-45300

[51] Int. Cl.[6] .................................................. H01R 13/62
[52] U.S. Cl. ............................................ 439/157; 439/911
[58] Field of Search ....................................... 439/157, 911

[56] References Cited

U.S. PATENT DOCUMENTS

| | | | |
|---|---|---|---|
| 5,191,970 | 3/1993 | Brockway et al. | 439/157 |
| 5,343,009 | 8/1994 | Araoka et al. | 439/157 |
| 5,675,475 | 10/1997 | Mazura et al. | 439/157 |

FOREIGN PATENT DOCUMENTS 2262389  6/1993  United Kingdom .

Primary Examiner—Gary Paumen
Assistant Examiner—Tho D. Ta
Attorney, Agent, or Firm—Antonelli, Terry, Stout & Kraus, LLP

[57] ABSTRACT

A power on/off mechanism of a plug-in unit driven by an insertion/ejection device in a printed circuit board (PCB) which is adapted to various power switch on/off switches in accordance with a characteristic of a plug-in unit, thus reducing manufacturing costs and easily maintaining parts. The mechanism includes a power switch on/off lever having a protrusion formed in one end thereof which is inserted into a guide groove formed in a center portion of the handle when inserting/ejecting the plug-in unit and a jaw formed in another end thereof for receiving the power switch lever. The power switch on/off lever is inserted into a lever engaging hole formed in the bracket, and the power switch lever is position in the interior of the jaw. When plug-in unit is inserted into the sub-rack, one end of the power switch on/off lever is inserted into the guide groove formed in the handle, the protrusion of the lever is lowered along the guide groove, the other end of the lever is lifted, and the power switch lever in the interior of the jaw of the lever turns to the on state. When ejecting the plug-in unit from the sub-rack, one end of the power switch on/off lever is ejected from the guide groove of the handle, the protrusion of the lever is lifted along the guide groove, and the power switch lever turns to the off state from the on state through a dead point.

2 Claims, 9 Drawing Sheets

POWER SWITCH ON/OFF MECHANISM OF PLUG-IN UNIT DRIVEN BY AN INSERTION/ EJECTION DEVICE IN A PRINTED CIRCUIT BOARD

BACKGROUND OF THE INVENTION

1. Field of the Invention

The present invention relates to a power switch on/off mechanism of a plug-in unit driven by an insertion/ejection device in a PCB (Printed Circuit Board), and particularly, to an improved power switch on/off mechanism of a plug-in unit driven by an insertion/ejection device in a PCB wherein a power switch installed in a plug-in unit can be activated in cooperation with a PCB insertion/ejection device which is used for inserting/ejection a plug-in unit into/from a sub-rack assembly.

2. Description of the Conventional Art

As the construction of the electronic system becomes complicated and high-integrated, a plurality of accurate electronic elements are mounted in a circuit pack. Therefore, the input/output (I/O) per PCB, namely, the number of connector pins reaches about 1,000.

Therefore, when inserting/ejecting a plug-in unit (a circuit pack) into/from a sub-rack of a system, when the connector pins of the plug-in unit are connected with the connector pins of a backplane installed in a sub-rack assembly and are separated therefrom, the connector pins do not concurrently contact therewith, so that the power is supplied to the plug-in unit under an unstable and inaccurate connection condition therebetween, thus causing a malfunction and damage of the circuit system.

In order to prevent the above-described problems, an on/off mechanism of a plug-in unit power switch is provided in an insertion/ejection device which is used for inserting/ejecting a plug-in unit into/from a sub-rack of the system and a printed circuit board (PCB), so that the power is supplied to the circuit system in such a manner that the connection pins of the plug-in unit and the connector pins of the backplane of the sub-rack assembly are accurately connected, and the supply of the power to the circuit system is stopped before the connector pins of the plug-in unit and the connector pins of the backplane of the sub-rack assembly are separated from each other, thus increasing the reliability of the system.

FIGS. 9A and 9B illustrate an operational sequence whereby a conventional circuit pack power on/off mechanism of an insertion/ejection device activates a power switch installed in a printed circuit board (PCB).

As shown therein, in the conventional circuit pack power on/off mechanism, a plug-in unit power switch 540 is installed in a printed circuit board (PCB) 550. A power switch lever 530 is installed in one end of the power switch 540. A power switch on/off protrusion 560 is integrated within handle 510 wherein the power switch lever 530 is inserted into the interior of a jaw 520 for an on/off operation of the power switch lever 530.

As shown in FIG. 9A, in order to install the plug-in unit into the sub-rack assembly, the handle 510 is upwardly moved in the direction indicated by the arrow in the drawings, the plug-in unit is forwardly moved along a guide rail 570. Thereafter, the handle 510 is further moved, the connector pins of the plug-in unit and the connection pins of the backplane are not accurately connected. In addition, as shown in FIG. 9B, the power switch on/off protrusion 560 of the handle 510 is inserted into the power switch lever 530 inside the jaw 520, so that the lever 530 is set at an on-state.

However, in the conventional on/off mechanism of the plug-in unit power switch, since the power switch lever 530 is converted into an on-state in a state that the connection pins of the plug-in unit and the connector pins of the backplane are nearly connected, the power switch on/off protrusion 560 is integral with the handle 510, and the handle 510 and the power switch on/off protrusion 560 are integrally moved, when inserting/ejecting the plug-in unit, the connection pins of the plug-in unit and the connector pins of the backplane may be separated from each other before the power switch lever 530 is fully converted into an off state.

In addition, when inserting/ejecting the plug-in unit having the power switch into/from the sub-rack, the on/off timing of the power switch installed in the PCB is very important. In the conventional on/off mechanism of the plug-in unit power switch, since there is no element for controlling the on/off timing of the power switch 540, it is impossible to accurately control the on/off timing of the power switch 540.

Generally, in accordance with the characteristic of the circuit pack, the on/off function of the circuit pack may be provided in the PCB of the plug-in unit. In the conventional on/off mechanism of the power switch, since the power switch on/off protrusion 560 and the handle 510 are integrally formed, and an insertion/ejection device to which the power switch on/off mechanism is adapted and another insertion/ejection device to which the same is not adapted must be separately fabricated, the fabrication cost is increased, and there are problems in maintaining the system. In addition, it is impossible to selectively use the above-described different functions.

SUMMARY OF THE INVENTION

Accordingly, it is an object of the present invention to provide an improved power on/off mechanism of a plug-in unit driven by an insertion/ejection device in a PCB (Printed Circuit Board) which overcomes the aforementioned problems encountered in the conventional art.

It is another object of the present invention to provide an improved power on/off mechanism of a plug-in unit driven by an insertion/ejection device in a PCB which is capable of effectively preventing a malfunction and damage of the system wherein a plug-in unit power switch is in an on state after the connector pins of the plug-in unit and the connector pins of the backplane are accurately connected to each other when injecting the plug-in unit into a sub-rack, and the connector pins of the plug-in unit and the connector pins of the backplane are separated from each other after the plug-in unit power switch become an off state when ejecting the plug-in unit from the sub-rack.

It is another object of the present invention to provide an improved power on/off mechanism of a plug-in unit driven by an insertion/ejection device in a PCB which is capable of accurately adjusting an on/off timing of the power switch when inserting/ejecting a plug-in unit having a power switch into/from a sub-rack.

It is another object of the present invention to provide an improved power on/off mechanism of a plug-in unit driven by an insertion/ejection device in a PCB which is capable of being adapted to various power switch on/off switches in accordance with a characteristic of a plug-in unit, for thus reducing the fabrication cost such as a molding cost, and easily maintaining parts.

To achieve the above objects, there is provided an improved power on/off mechanism of a plug-in unit driven by an insertion/ejection device in a PCB which includes a power switch on/off lever having a protrusion formed in one end thereof, wherein protrusion is inserted into a guide groove formed in a center portion of the handle when inserting/ejecting the plug-in unit and a jaw formed in another end thereof for receiving the power switch lever, wherein the power switch on/off lever is inserted into a lever engaging hole formed in the bracket, and the power switch lever is positioned in the interior of the jaw, wherein further, when injecting the plug-in unit into the sub-rack one end of the power switch on/off lever is inserted into the guide groove formed in the handle, the protrusion of the lever is lowered along the guide groove, the other end of the lever is lifted, and the power switch lever in the interior of the jaw of the lever becomes an on state, and wherein further still, when ejecting the plug-in unit from the sub-rack, one end of the power switch on/off lever is ejected from the guide groove of the handle, the protrusion of the lever is lifted along the guide groove, and the power switch lever is in an off state from the on state through a dead point.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The power switch on/off mechanism of a plug-in unit driven by an insertion/ejection device or in a printed circuit board (PCB) according to the present invention will now be explained with reference to the accompanying drawings.

Figure 1:
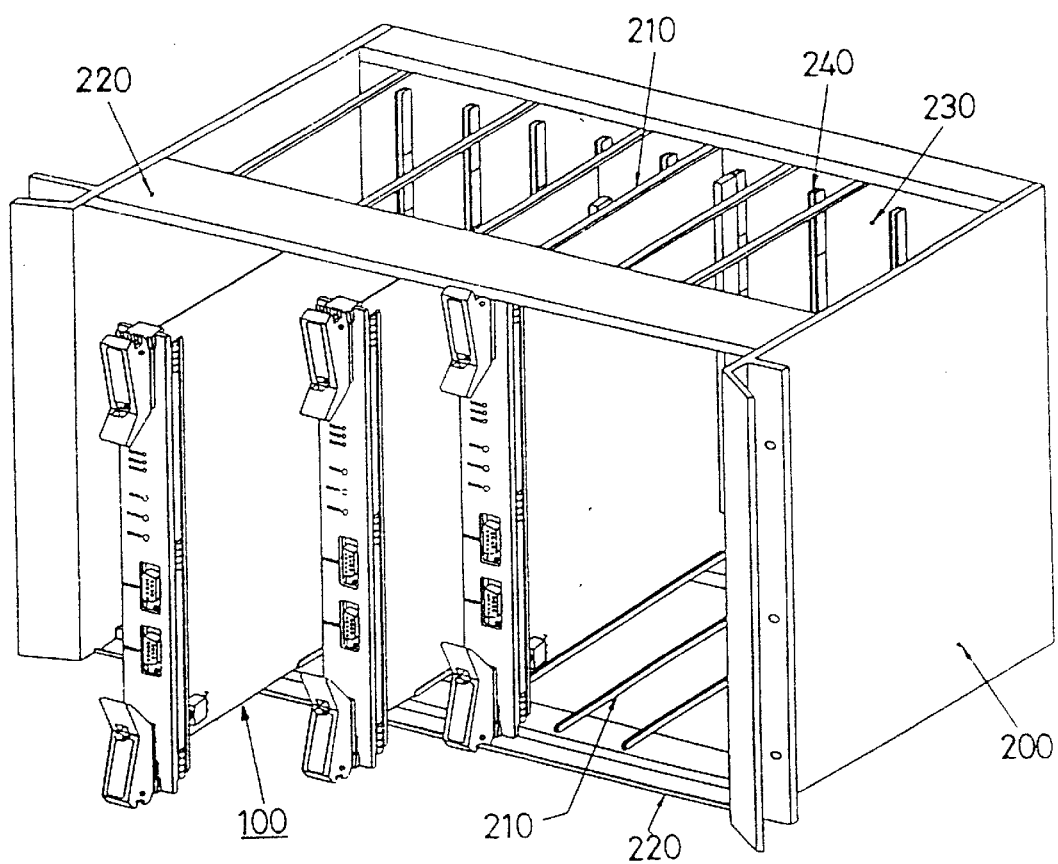
FIG. 1 is a perspective view illustrating a plug-in unit inserted into a conventional sub-rack which is used in an electronic system.

FIG. 1 illustrates a state that a plug-in unit is inserted into a conventional sub-rack which is used in an electronic system.

In the drawings, reference numeral 100 denotes a plug-in unit having various electronic elements and other elements, 200 denotes a sub-rack assembly, 210 denotes a guide rail for guiding the plug-in unit 100 to a portion of a back plane, 220 denotes a guide rail support portion for supporting the guide rail 210, 230 denotes a back plane, and 240 denotes a connection of the back plane 230 connected with a connector of the plug-in unit.

Figure 2:
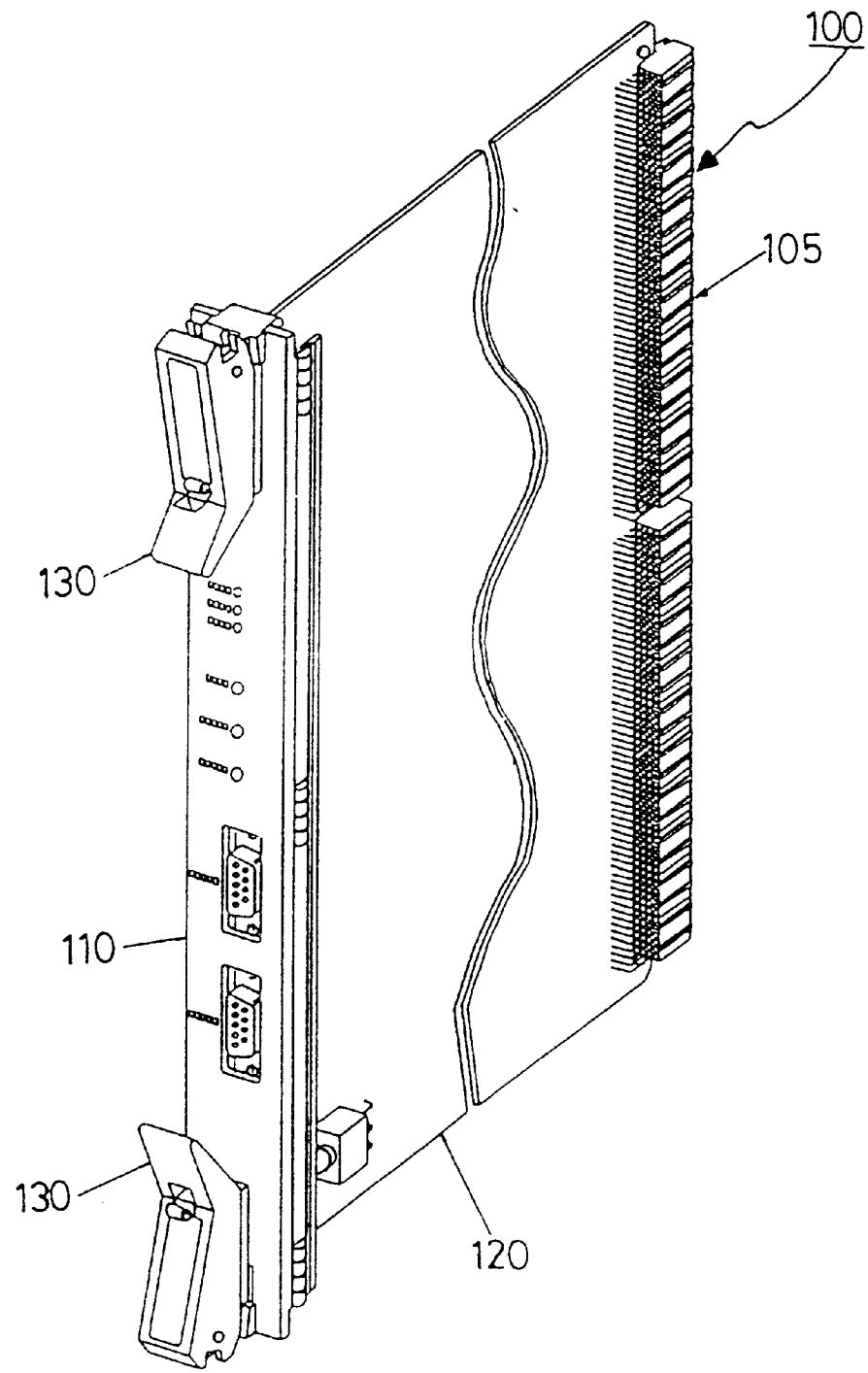
FIG. 2 is a perspective view illustrating a plug-in unit used in an electronic system in FIG. 1.

FIG. 2 is a perspective view illustrating a plug-in unit used in an electronic system in FIG. 1.

As shown therein, there are shown a plug-in unit 100 inserted into the sub-rack 200 for performing the functions of electronic elements. Namely, an insertion/ejection device 130 having a circuit pack power on/off mechanism is engaged to a PCB 120 in cooperation with a front panel 110. In FIG. 2, reference numeral 105 denotes a connector of the plug-in unit, 110 denotes a front panel, 120 denotes a printed circuit board (PCB), and 130 denotes a PCB insertion/ejection device.

Figure 3:
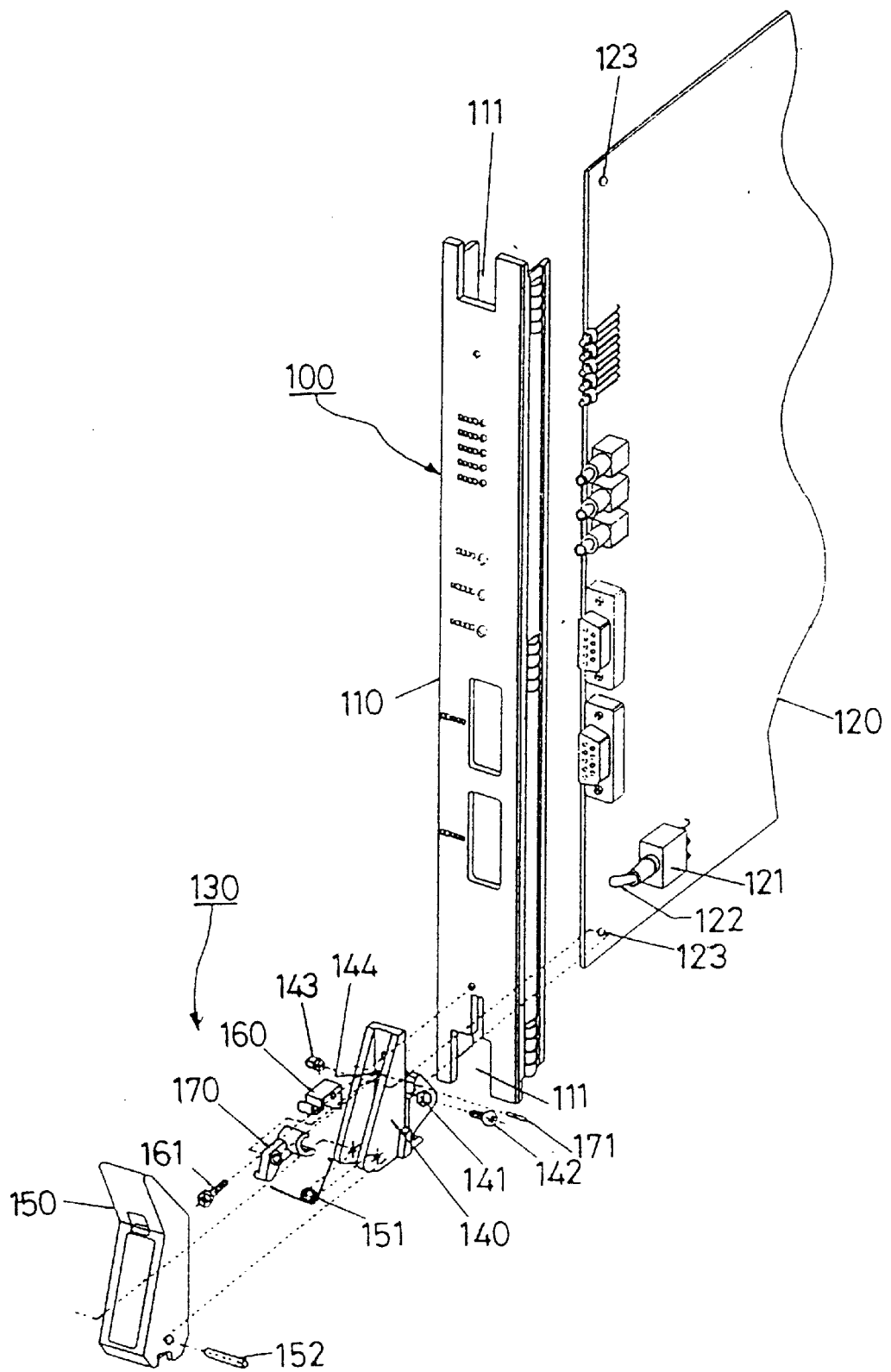
FIG. 3 is an expanded perspective view illustrating an insertion/ejection device equipped with a circuit pack power on/off mechanism, a printed circuit board (PCB), and a front panel which are elements of a plug-in unit according to the present invention.

FIG. 3 is an exploded perspective view illustrating an insertion/ejection device 130 equipped with a circuit pack power on/off mechanism, a printed circuit board 120 (PCB), and a front panel 110 which are elements of a plug-in unit according to the present invention.

As shown therein, in order to form the plug-in unit 100, a handle 150 and a bracket 140 are engaged with a spring pin 152 together with a spring 151. A fixing hole portion 141 of a bracket 140 is inserted into a notch 111 formed on upper and lower portions of the front panel 110, and a bolt 142 is inserted into a fixing hole 141 of the bracket 140 and a fixing portion hole 123 of the PCB 120, and then a nut 143 is engaged to the bolt 142, for thus fixing the PCB 120 to the front panel 110, and a locker 160 and the bracket 140 are fixed to the front panel 110 by using a bolt 161. Here, the assembling sequence of the insertion/ejection device 130 installed in upper and lower portions of the front panel 110 is identical to the above-described sequence.

In addition, when the plug-in power switch 121 installed in a portion of the PCB 120 and having the power switch lever 122 is moved by using the PCB insertion/ejection device 130, the power switch on/off lever 170 is inserted into a lever engaging hole 144 formed in the bracket 140, and the pin 171 is inserted into a pin insertion hole formed in the bracket and a pin insertion hole formed in a center of the power switch on/off lever 170.

When assembling the insertion/ejection device 130 having the power switch on/off lever 170 to the PCB 120 and the front panel 110, the lever 122 of the plug-in power switch 121 mounted on the PCB 120 is positioned in the interior of the jaw of the power switch on/off lever 170.

Figure 4A:
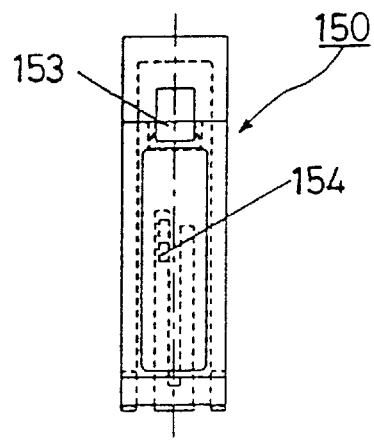
FIG. 4A is a front view illustrating a handle of an insertion/ejection device according to the present invention.
Figure 4B:
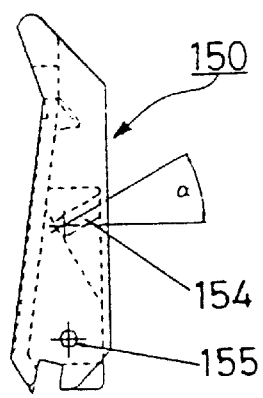
FIG. 4B is a side view illustrating a handle of an insertion/ejection device according to the present invention.
Figure 4C:
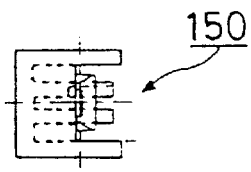
FIG. 4C is a plan view illustrating a handle of an insertion/ejection device according to the present invention.

FIGS. 4A, 4B, and 4C are front, side and plan views illustrating a handle of an insertion/ejection device according to the present invention.

Figure 6A:
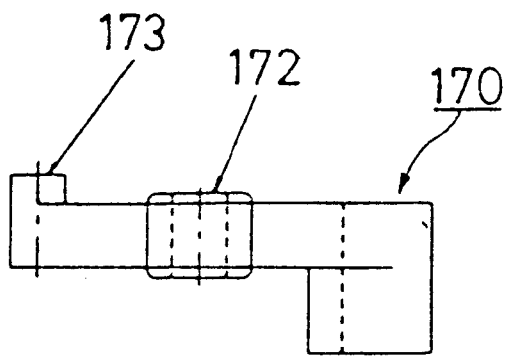
FIG. 6A is a plan view illustrating a power switch on/off lever according to the present invention.

As shown therein, a square-shaped hole 153 is formed in an upper portion of the handle 150, wherein the hole 153 acts as an engaging portion into which a locker 160 fixed to the front panel 110 is fixedly inserted when the plug-in unit 100 is engaged to the sub-rack assembly 200. A guide groove 154 is formed in a center of the handle 150 for guiding the protrusion 173 (as shown in FIG. 6A) of the power switch on/off lever 170 when inserting/ejecting the plug-in unit 100. A spring pin insertion hole 155 is formed in a lower portion of the handle 150 into which insertion hole 155 the spring pin 152 is inserted when engaging the handle 150 and the spring 151 are engaged with the bracket 140.

Figure 5A:
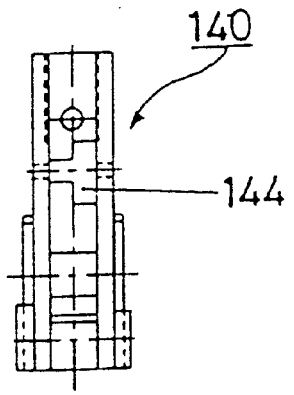
FIG. 5A is a front view illustrating a bracket of an insertion/ejection device according to the present invention.
Figure 5B:
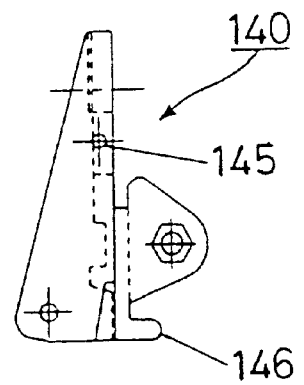
FIG. 5B is a side view illustrating a bracket of an insertion/ejection device according to the present invention.
Figure 5C:
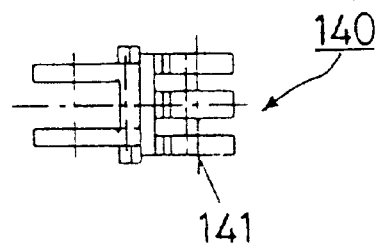
FIG. 5C is a plan view illustrating a bracket of an insertion/ejection device according to the present invention.

FIGS. 5A, 5B, and 5C are front, side and plan views illustrating a bracket 140, which is an element of the insertion/ejection device 130, according to the present invention.

The bracket 140 is engaged to the handle 150, the front panel 110, and the PCB 120 and receives the power switch on/off lever 170 therein. As shown in FIGS. 5A through 5C, a lever engaging hole 144 is formed in an upper center portion thereof into which hole 144 the power switch on/off lever 170 is inserted. A pin insertion hole 145 is formed beside the lever engaging hole 144 into which hole 145 a pin 171, which supports the power switch on/off lever 170 inserted into the lever engaging hole 144, is inserted. A fixing hole 141 is formed in a portion thereof into which hole 141 a bolt 142 is inserted when fixing the PCB 120 to the bracket 140. A support protrusion 146 is formed in a lower portion of the bracket 140 and is inserted into a support groove 221 (as shown in FIG. 7A) formed in a guide rail support portion 220 when engaging the plug-in unit 100 into the sub-rack assembly 200.

Figure 6B:
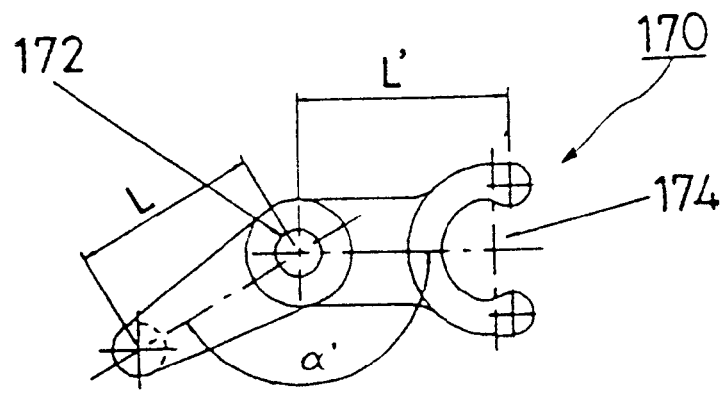
FIG. 6B is a front view illustrating a power switch on/off lever according to the present invention.

FIGS. 6A and 6B are plan and front views illustrating a power switch on/off lever 170 according to the present invention. A pin insertion hole 172 is formed in a center of the lever 170 into which hole 172 a pin 171 is inserted when the lever 170 is engaged to the lever engaging hole 144 of the bracket 140. A protrusion 173 is formed in one end thereof, and the protrusion 173 is inserted into the guide groove 154 formed in the center of the handle 150, for thus guiding the lever 170 along the guide groove 154 when inserting/ejecting the plug-in unit 100, and a jaw 174 is formed in another end thereof for receiving the lever 122 of the power switch 121 mounted on the PCB 120.

When inserting/ejecting device the plug-in unit 100 into/from the sub-rack assembly 200, the operational sequence that the circuit pack on/off mechanism of the insertion/ejection device according to the present invention activates the plug-in unit power switch 121 mounted on the PCB 120 will now be explained with reference to FIGS. 7 and 8.

Figure 7A:
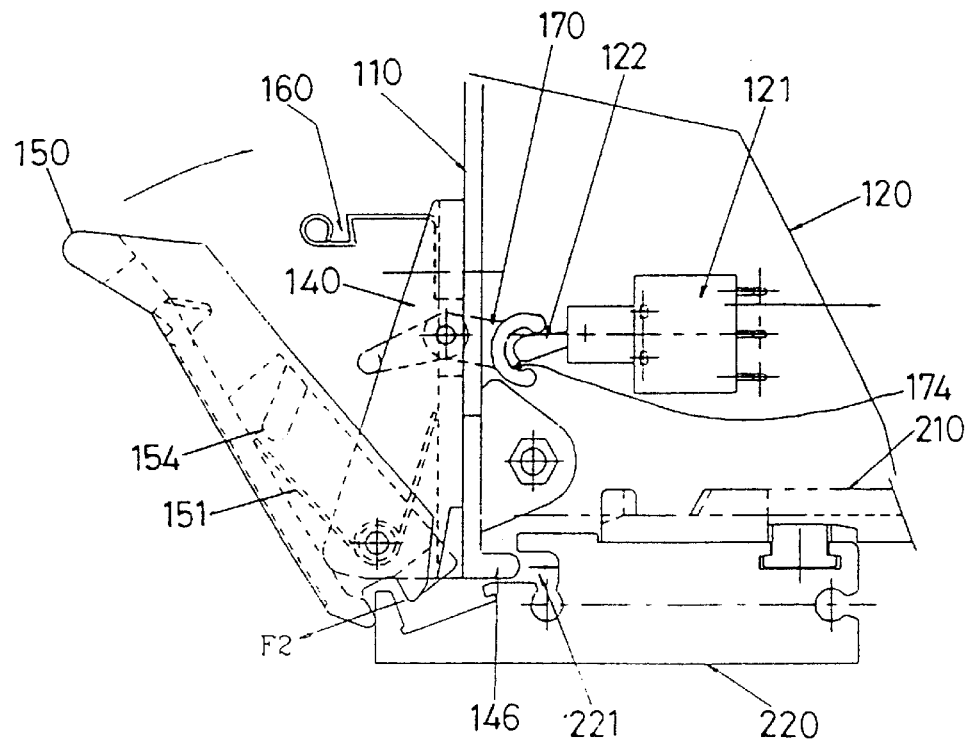
FIGS. 7A and 7B are views illustrating an operational sequence that a circuit pack power on/off mechanism of an insertion/ejection device according to the present invention activates a power switch installed in a printed circuit board (PCB)
Figure 7B:
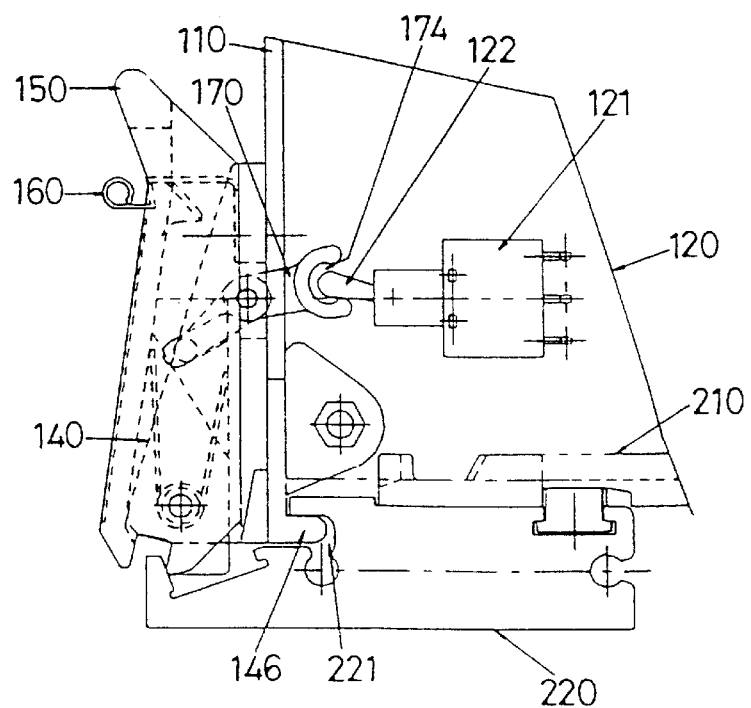

FIGS. 7A and 7B are views illustrating an operational sequence that a circuit pack power on/off mechanism of an insertion/ejection device according to the present invention activates a power switch installed in a printed circuit board (PCB).

As shown therein, when inserting/ejecting device the plug-in unit 100 with the power switch 121 into/from the sub-rack 200, the on/off timing of the power switch 121 mounted on the PCB 120 is important. Namely, when injecting the plug-in unit 100 into the sub-rack 200, the plug-in unit power switch 121 must be in the on state after the connector pins 105 of the plug-in unit 100 and the connector pins 240 of the backplane of the sub-rack assembly 200 are fully connected with each other. In addition, when ejecting the plug-in unit 100 therefrom, the connector pins 105 of the plug-in unit 100 and the connector pins 240 of the back plane 230 must be separated from each other after the plug-in unit power switch 121 is in the off state.

As shown in FIG. 7A, in order to engage the plug-in unit 100 to the sub-rack 200, the plug-in unit 100 is inserted into the sub-rack 200, and then the plug-in unit 100 is inwardly moved along the guide rail 210 of the sub-rack 200. At this time, the power switch lever 122 in the interior of the jaw 174 of the power switch on/off lever 170 remains in the off state.

When the plug-in unit 100 is fully inserted into the sub-rack 200, as shown in FIG. 7B, the locker 160 is inserted into the square-shaped hole 153 formed in the upper portion of the handle 150 and then is engaged thereto, so that the handle 150 is closely fixed to the bracket 140, and the support protrusion 146 protruded from a lower portion of the bracket 140 is inserted into the support groove 221 of the guide rail support portion 220, and the plug-in unit 100 is engaged into the sub-rack assembly 200. At this time, one end of the power switch on/off lever 170 is inserted into the guide groove 154 formed in the handle 150, and the protrusion 173 protruded from a portion of the power switch on/off lever 170 is lowered along the guide groove 154, and then the other end of the lever is lifted, whereby the lever 122 of the plug-in unit power switch 121 received into the interior of the jaw 174 is in the on state.

The above-described operations will now be explained in more detail with reference to FIGS. 8A through 8C.

Figure 8A:
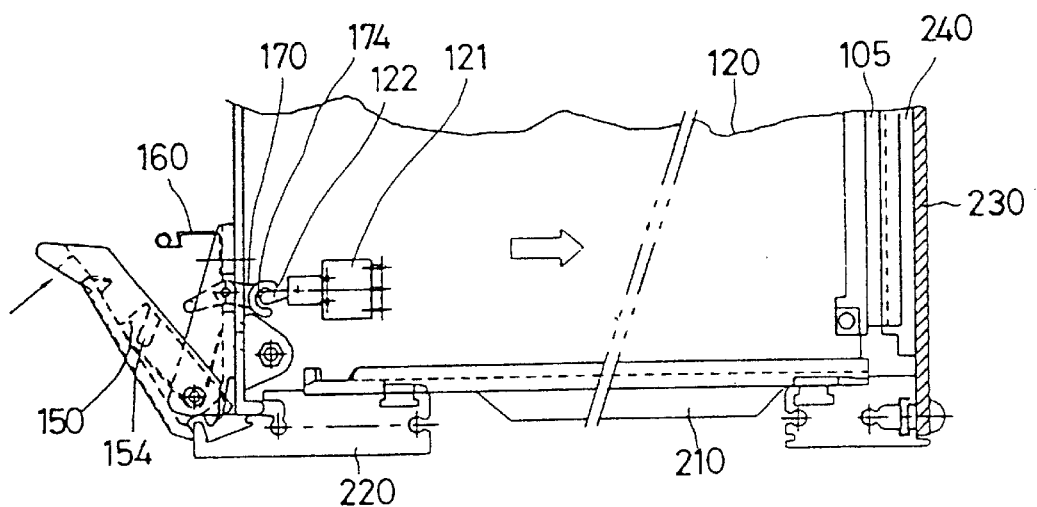
FIGS. 8A through 8C are views illustrating an operational sequence that a circuit pack power on/off mechanism of an insertion/ejection device according to the present invention activates a plug-in unit power switch installed in a printed circuit board (PCB)
Figure 8B:
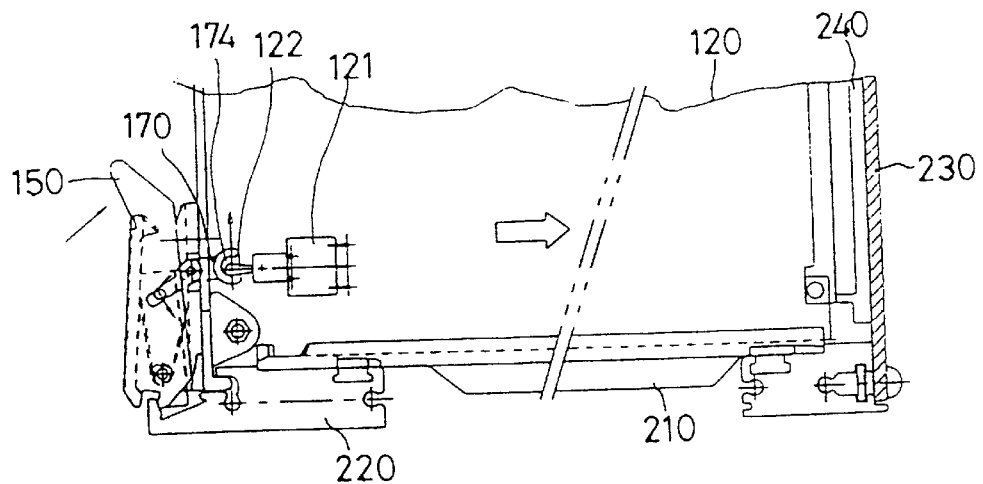
Figure 8C:
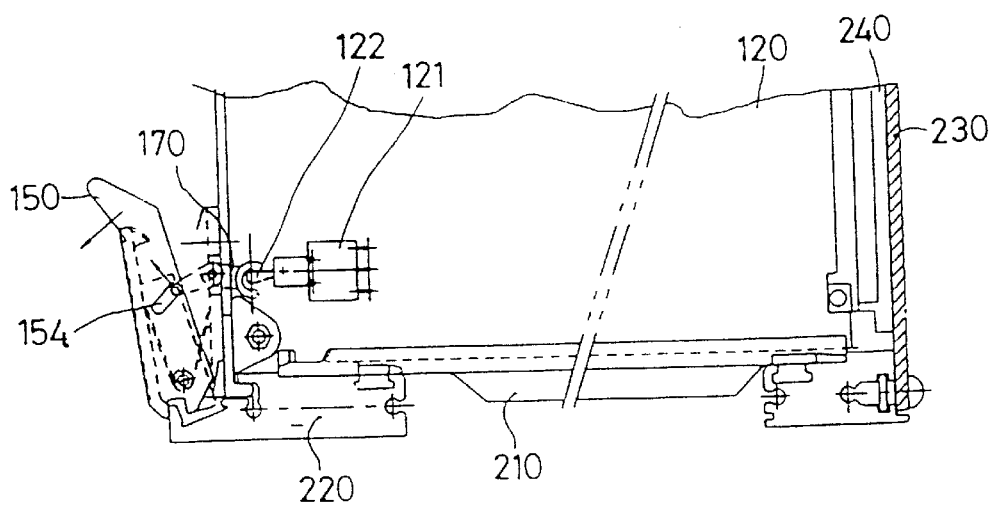
Figure 9A:
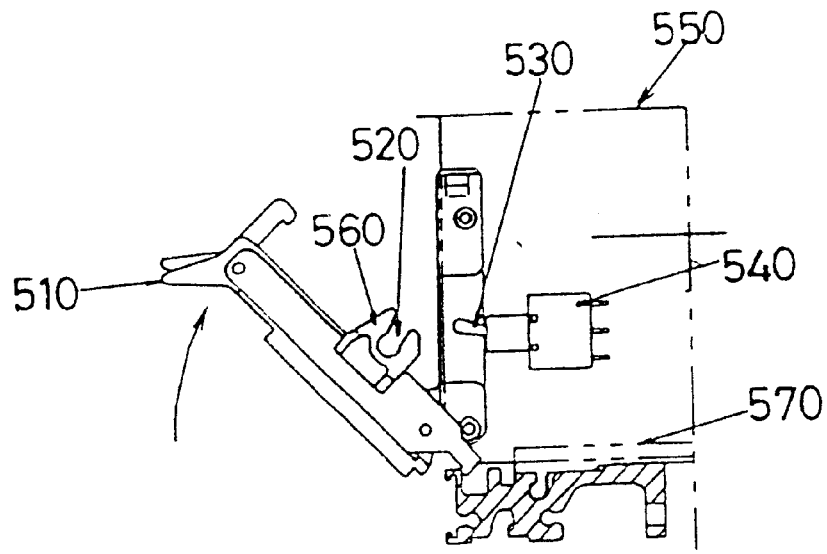
FIGS. 9A and 9B are views illustrating an operational sequence that a conventional circuit pack power on/off mechanism of an insertion/ejection device activates a power switch installed in a printed circuit board (PCB).
Figure 9B:
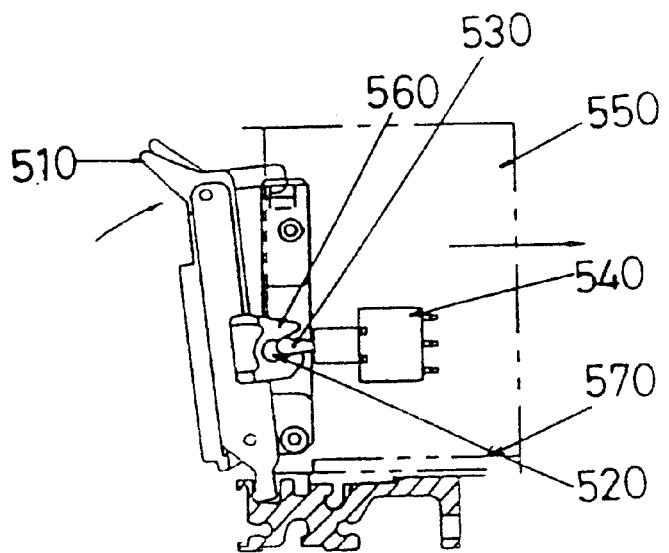

FIGS. 8A through 8C are views illustrating an operational sequence so that a circuit pack power on/off mechanism of an insertion/ejection device according to the present invention activates a plug-in unit power switch installed in a printed circuit board (PCB).

As shown therein, FIG. 8A illustrates a state just before the connector pins 105 of the plug-in unit 100 and the connector pins 240 of the back plane 230 are connected when the plug-in unit 100 is engaged to the sub-rack 200. Namely, the power switch lever 122 is inserted into the interior of the jaw 174 of the power switch on/off lever 170 in an off state, irrespective of the movement of the handle 150 and the power switch on/off lever 170.

Thereafter, when the handle 150 is further moved in the direction indicated by the arrow, the connector pins 105 of the plug-in unit 100 and the connector pins 240 of the back plane 230 are connected to each other. As shown in FIG. 8B, when the connector pins of the plug-in unit connector pin 105 and the back plane connector pin 240 are connected in excess of 90%, the power switch lever 122 transitions to the on state from the off state through a dead point by the lifting of the jaw 174 of the power switch on/off lever 170.

In addition, when ejecting the plug-in unit 100 from the sub-rack 200, as shown in FIG. 8C, the power switch lever 122 turns to the off state from the on state through the dead point by the lifting of the protrusion 173 of the power switch on/off lever 170 by slightly moving the handle 150 in the direction indicated by the arrow in the drawings irrespective of the relative movement between the back plane 230 and the plug-in unit 100. Thereafter, when further moving the handle 150 in the direction indicated by the arrow in the drawings, the connector pins 105 of the plug-in unit 100 are separated from the connector pins 240 of the back plane 230.

As described above, in the power switch on/off mechanism of a plug-in unit driven by an insertion/ejection device in a printed circuit board (PCB) according to the present invention, when injecting the plug-in unit 100 into the sub-rack 200, the plug-in unit power switch 121 turns to the on state after the connector pins 105 of the plug-in unit 100 and the connector pins 240 of the back plane are fully connected to each other. In addition, when ejecting the plug-in unit 100 from the sub-rack 200, the connector pins 105 of the plug-in unit 100 and the connector pins 240 of the back plane are separated from each other after the plug-in unit power switch 121 turns to the off state, whereby it is possible to effectively prevent the malfunction of the system and the system damage.

In addition, in the power switch on/off mechanism of a plug-in unit driven by an insertion/ejection device in a printed circuit board (PCB) according to the present invention, since it is possible to more easily disassemble the system from the bracket 140 by using power switch on/off lever 170 and assemble the system, it is possible to more selectively adapt the power switch on/off mechanism in accordance with the characteristic of the plug-in unit 100, whereby it is possible to significantly reduce the fabrication cost such as a molding cost and more easily maintain the parts of the system.

In addition, as shown in FIG. 4B, it is possible to adjust the on/off timing of the power switch 121 by changing the slanted angle α' of the guide groove 154 formed in the handle 150, the bent angle α' of the lever 170, and the lengths L and L' of the lever 170 from the pin insertion hole 172.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A power switch on/off mechanism of a plug-in unit driven by an insertion/ejection device mounted to a printed circuit board (PCB) wherein said power switch on/off mechanism includes said insertion/ejection device having a handle and a bracket mounted to the front panel for inserting/ejecting the plug-in unit from a sub-rack, and the PCB having a plug-in unit power switch having a power switch lever, said power switch on/off mechanism comprising:

a power switch on/off lever including:

a protrusion formed in one end of said power switch on/off lever, a guide groove formed in a center portion of said handle for receiving said protrusion therein when inserting/ejecting said plug-in unit, and a jaw formed in another end of said power switch on/off lever for receiving the power switch lever;

wherein the power switch on/off lever is inserted into a lever engaging hole formed in said bracket, and said power switch lever of said plug-in unit power switch is disposed in an interior of said jaw, wherein further when inserting said plug-in unit into said sub-rack, said protrusion of said power switch on/off lever is inserted into said guide groove formed in said handle, said protrusion of said power-switch on/off power switch on/off lever is lowered along said guide groove, said jaw of said lever is lifted, and said power switch lever of said plug-in unit power switch in the interior of said jaw turns to the on state, and wherein further still, when ejecting the plug-in unit from the sub-rack, said protrusion of said power switch on/off lever is lifted along said guide groove of the handle and ejected from said guide groove, said jaw is lowered and said power switch lever of said plug-in unit power switch turns to the off state from the on state through a dead point.

2. The power switch on/off mechanism of claim 1, further comprising means for adjusting an on/off timing of said plug-in unit power switch by changing a slanted angle of the guide groove formed in the handle, a bent angle of said power switch on/off lever, and a length of the lever from a pin insertion hole.

\* \* \* \* \*

UNITED STATES PATENT AND TRADEMARK OFFICE
CERTIFICATE OF CORRECTION

PATENT NO : 5,989,043
DATED : November 23, 1999
INVENTOR(S) : Jae-Sup HAN, et al.

It is certified that error appears in the above-identified patent and that said Letters Patent is hereby corrected as shown below:

On title page, item 73 Assignee
replace "Electronics and Telecommunications Research Institute, Daejon, Rep. of Korea"
with --Electronics and Telecommunications Research Institute, Daejon, Rep. of Korea, and Korea Telecommunication Authority, Seoul, Rep. of Korea.--

Signed and Sealed this

Twenty-seventh Day of March, 2001

Attest:

NICHOLAS P. GODICI

Attesting Officer

Acting Director of the United States Patent and Trademark Office